US008014475B2

(12) United States Patent
Howard

(10) Patent No.: US 8,014,475 B2
(45) Date of Patent: Sep. 6, 2011

(54) METHOD AND ARRANGEMENT FOR AUTOMATIC FREQUENCY CONTROL IN A COMMUNICATION SYSTEM

(75) Inventor: Paul Howard, Horfield (GB)

(73) Assignee: Wireless Technology Solutions LLC, New York, NY (US)

( * ) Notice: Subject to any disclaimer, the term of this patent is extended or adjusted under 35 U.S.C. 154(b) by 772 days.

(21) Appl. No.: 10/556,560

(22) PCT Filed: May 17, 2004

(86) PCT No.: PCT/GB2004/002111
§ 371 (c)(1),
(2), (4) Date: Jan. 29, 2007

(87) PCT Pub. No.: WO2004/102801
PCT Pub. Date: Nov. 25, 2004

(65) Prior Publication Data
US 2007/0140386 A1 Jun. 21, 2007

(30) Foreign Application Priority Data
May 16, 2003 (GB) .................................. 0311311.5

(51) Int. Cl.
*H04L 27/06* (2006.01)
(52) U.S. Cl. ........................................................ 375/344
(58) Field of Classification Search .................. 375/344, 375/316, 130; 455/182.2, 192.2; 331/33 C, 331/36 L; 332/126
See application file for complete search history.

(56) References Cited

U.S. PATENT DOCUMENTS
4,518,922 A 5/1985 Luecke
6,044,118 A 3/2000 Schetelig et al.
6,985,705 B2 * 1/2006 Shohara ..................... 455/164.1

2002/0150147 A1 * 10/2002 Liang ........................... 375/133
2003/0112899 A1 6/2003 Linsky et al.

FOREIGN PATENT DOCUMENTS
JP 9-186731 7/1997
(Continued)

OTHER PUBLICATIONS
International Search Report for PCT/BG2004/002111, mailed on Sep. 9, 2004, 3 pages.
(Continued)

*Primary Examiner* — Khai Tran
(74) *Attorney, Agent, or Firm* — Fitch Even Tabin & Flannery

(57) ABSTRACT

An arrangement (900), method and unit for AFC in a communication system (100) having: a frequency estimator (980) producing a decision-directed frequency estimate from a received signal; and an AFC loop receiving the decision-directed frequency estimate and performing therewith frequency control. The AFC process may use a CRC-decision directed frequency estimate as the final stage in a multi-stage AFC process (preceded by SCH- and midamble-derived frequency estimate stages), such that a verified received data sequence is used to re-construct a local copy of the ideal received data symbols expected at the output of a detector. This local copy is then correlated with the actual detector output and the results used to estimate the frequency error present on the received signal. The AFC process is inherent suited for discontinuous receive (DRX) applications. This provides the advantage of allowing required frequency correction accuracy to have minimal impact on the error rate of the received data in various channel configurations.

36 Claims, 10 Drawing Sheets

FOREIGN PATENT DOCUMENTS

WO  WO-99/54998  10/1999
WO  WO-03/024046  3/2003

OTHER PUBLICATIONS

3rd Generation Partnership Project, Technical Specification Group Services and System Aspects, Technical Specifications and Technical Reports for a UTRAN-based 3GPP system, (Release 6) 3GPP TS 21.101 V6.2.0 (Jun. 2005).
3rd Generation Partnership Project, Technical Specification Group Services and System Aspects, Evolution of 3GPP System, (Release 6) 3GPP TR 21.902 V6.0.0 (Sep. 2003).
3rd Generation Partnership Project, Technical Specification Group Services and Systems Aspects, Network Architecture (Release 6) 3GPP TS 23.002 V6.8.0 (Jun. 2005).
3rd Generation Partnership Project, Technical Specification Group Radio Access Network, User Equipment (UE) radio transmission and reception (FDD) (Release 6) 3GPP TS 25.101 V6.8.0 (Jun. 2005).
3rd Generation Partnership Project, Technical Specification Group Radio Access Network, User Equipment (UE) radio transmission and reception (TDD) (Release 6) 3GPP TS 25.102 V6.1.0 (Jun. 2005).
3rd Generation Partnership Project, Technical Specification Group Radio Access Network, Base Station (BS) radio transmission and reception (FDD) (Release 6) 3GPP TS 25.104 V6.9.0 (Jun. 2005).
3rd Generation Partnership Project, Technical Specification Group Radio Access Network, Base Station (BS) radio transmission and reception (TDD) (Release 6) 3GPP TS 25.105 V6.2.0 (Dec. 2004).
3rd Generation Partnership Project, Technical Specification Group Radio Access Network, Physical channels and mapping of transport channels onto physical channels (FDD) (Release 6), 3GPP TS 25.211 V6.5.0 (Jun. 2005).
3rd Generation Partnership Project, Technical Specification Group Radio Access Network, Multiplexing and channel coding (FDD) (Release 6), 3GPP TS 25.212 V6.5.0 (Jun. 2005).
3rd Generation Partnership Project, Technical Specification Group Radio Access Network, Spreading and modulation (FDD) (Release 6) 3GPP TS 25.213 V6.3.0 (Jun. 2005).
3rd Generation Partnership Project, Technical Specification Group Radio Access Network, Physical layer procedures (FDD) (Release 6) 3GPP TS 25.214 V6.6.0 (Jun. 2005).
3rd Generation Partnership Project, Technical Specification Group Radio Access Network, Physical layer—Measurements (FDD) (Release 6) 3GPP TS 25.215 V6.3.0 (Jun. 2005).
3rd Generation Partnership Project, Technical Specification Group Radio Access Network, Physical channels and mapping of transport channels onto physical channels (TDD) (Release 6) 3GPP TS 25.221 V6.4.1 (Jun. 2005).
3rd Generation Partnership Project, Technical Specification Group Radio Access Network, Multiplexing and channel coding (TDD) (Release 6 ) 3GPP TS 25.222 V6.2.0 (Dec. 2004).
3rd Generation Partnership Project, Technical Specification Group Radio Access Network, Spreading and modulation (TDD) (Release 6) 3GPP TS 25.223 V6.0.0 (Dec. 2003).
3rd Generation Partnership Project, Technical Specification Group Radio Access Network, Physical layer procedures (TDD) (Release 6) 3GPP TS 25.224 V6.5.0 (Jun. 2005).
3rd Generation Partnership Project, Technical Specification Group Radio Access Network, Physical layer, Measurements (TDD) (Release 6) 3GPP TS 25.225 V6.1.0 (Mar. 2004).
3rd Generation Partnership Project, Technical Specification Group Radio Access Network, FDD Enhanced Uplink, Overall description, Stage 2 (Release 6) 3GPP TS 25.309 V6.3.0 (Jun. 2005).
3rd Generation Partnership Project, Technical Specification Group Radio Access Network, Feasibility Study on Uplink Enhancements for UTRA TDD (Release 6) 3GPP TR 25.804 V2.0.0 (Feb. 2005).
3rd Generation Partnership Project, Technical Specification Group Radio Access Network, FDD Enhanced Uplink, Physical Layer Aspects (Release 6) 3GPP TR 25.808 V2.0.0 (Mar. 2005).
3rd Generation Partnership Project, Technical Specification Group Radio Access Network, Physical layer aspects of UTRA High Speed Downlink Packet Access (Release 4) 3GPP TR 25.848 V4.0.0 (Mar. 2001).
3rd Generation Partnership Project, Technical Specification Group Radio Access Network, Feasibility Study considering the viable deployment of UTRA in additional and diverse spectrum arrangements (Release 6) 3GPP TR 25.889 V6.0.0 (Jun. 2003).
3rd Generation Partnership Project, Technical Specification Group Radio Access Network, Feasibility Study for Enhanced Uplink for UTRA FDD (Release 6) 3GPP TR 25.896 V6.0.0 (Mar. 2004).
"3rd Generation Partnership Project; Technical Specification Group Radio Access Network; Physical Layer Procedures (TDD); (3G TS 25.224 version 3.0.0)," (Oct. 1999). 3GPP:Valbonne, France, TS 25.224 v3.0.0:1-15.
"3rd Generation Partnership Project; Technical Specification Group Radio Access Network; UTRAN Overall Description (Release 6)," (Dec. 2003). 3GPP:Valbonne, France, TS 25.401 v6.2.0:1-44.
"3rd Generation Partnership Project; Technical Specification Group Services and System Aspects; General Packet Radio Service (GPRS); Service Description; Stage 2 (Release 1999)," (Dec. 2003). 3GPP:Valbonne, France, TS 23.060 v3.16.0:1-194.
Great Britain Search Report mailed Oct. 3, 2003, for Great Britain Application No. GB 0311311.5 filed May 16, 2003, 3 pages.
Meyer, H. et al. (1998). "(DD&De) Carrier Phasor Estimation and Phase Error Feedback" Chapter 5.8 In *Digital Communication Receivers: Synchronization, Channel Estimation, and Signal Processing*. John Wiley & Sons, Inc.: New York, pp. 311-313.
Communication Pursuant to Article 96(2) EPC dated Dec. 22, 2006 from European Application No. 04 733 378.6-1233.
Communication Pursuant to Article 94(3) EPC dated Aug. 3, 2010 from European Application No. 04 733 378.6-1233.
Giorgio Picchi and Giancarlo Prati; "Blind Equalization and Carrier Recovery Using a 'Stop-and-Go' Decision-Directed Algorithm;" 8089 IEEE Transactions on Communications COM-35 (1987) Sep., No. 9, New York, NY, USA.
Michael P. Fitz and William C. Lindsey, "Decision-Directed Bust-Mode Carrier Synchronization Techniques;" 8089 IEEE Transactions on Communications 40 (1992) Oct., No. 10, New York, NY, USA.

* cited by examiner

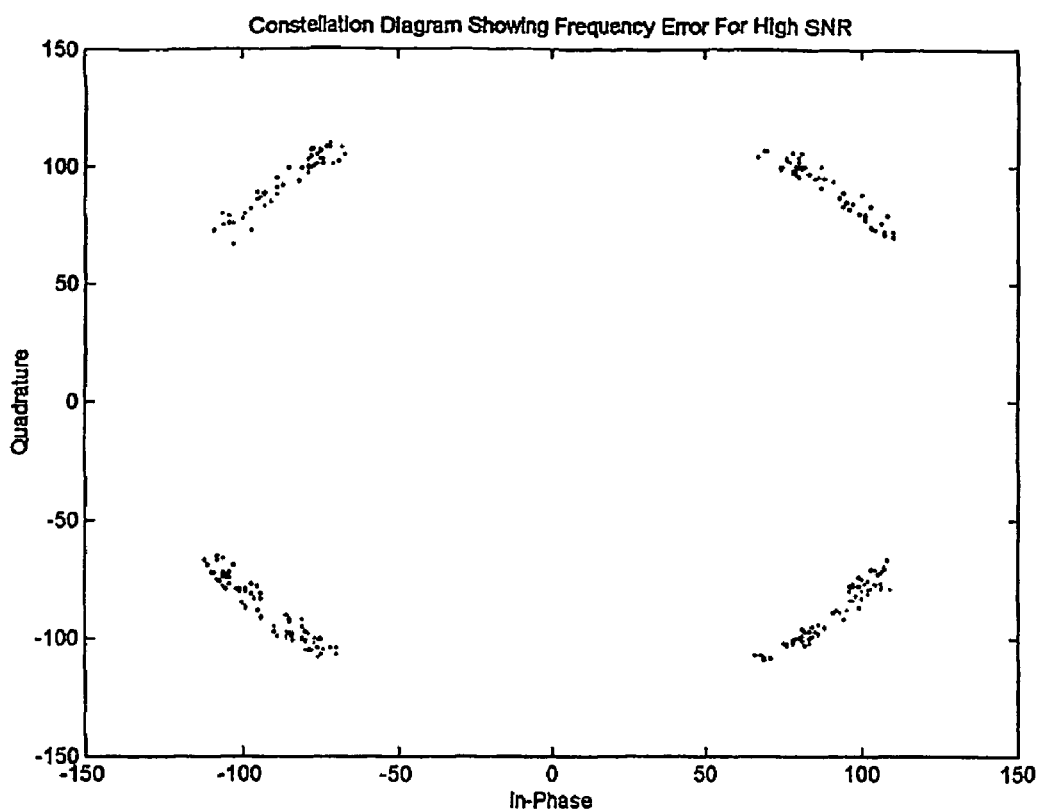
FIG. 5A
FIG. 5B
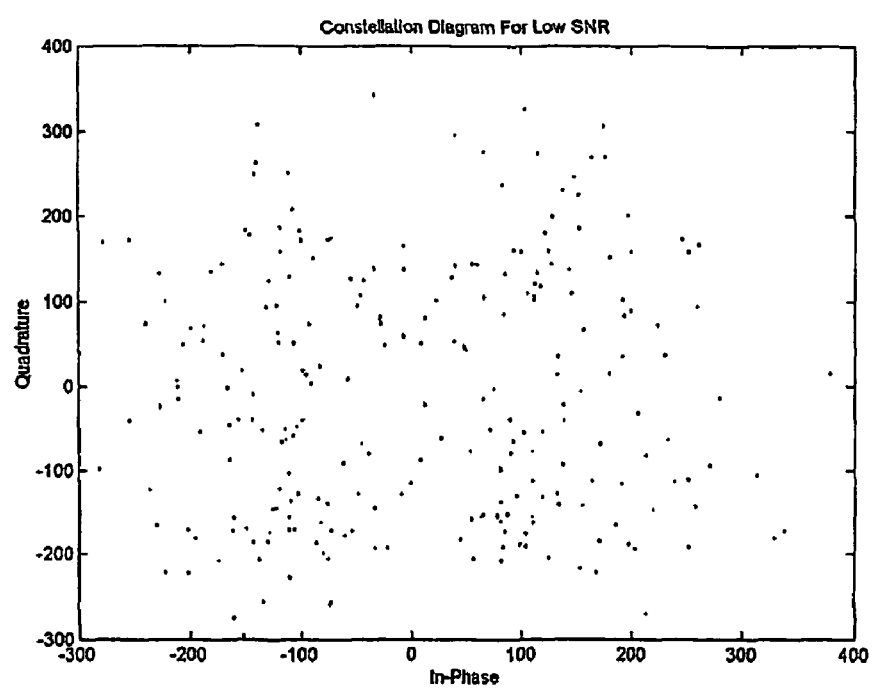

FIG. 8A
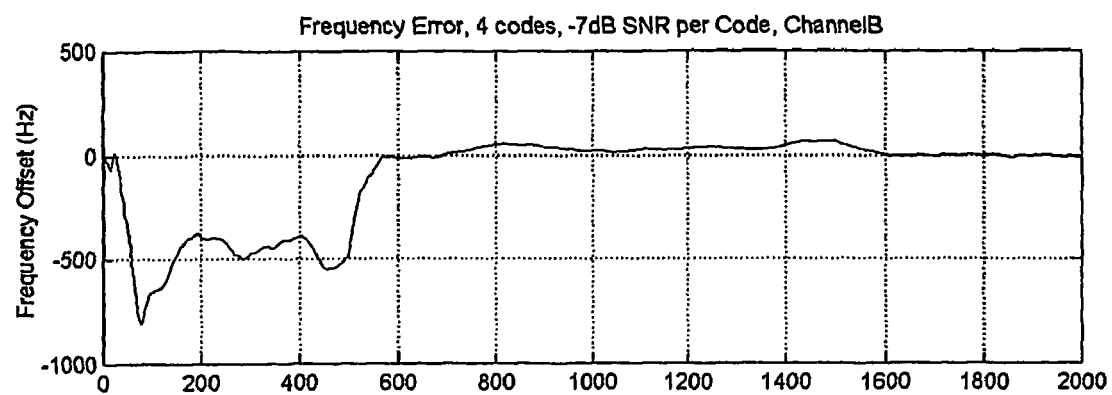
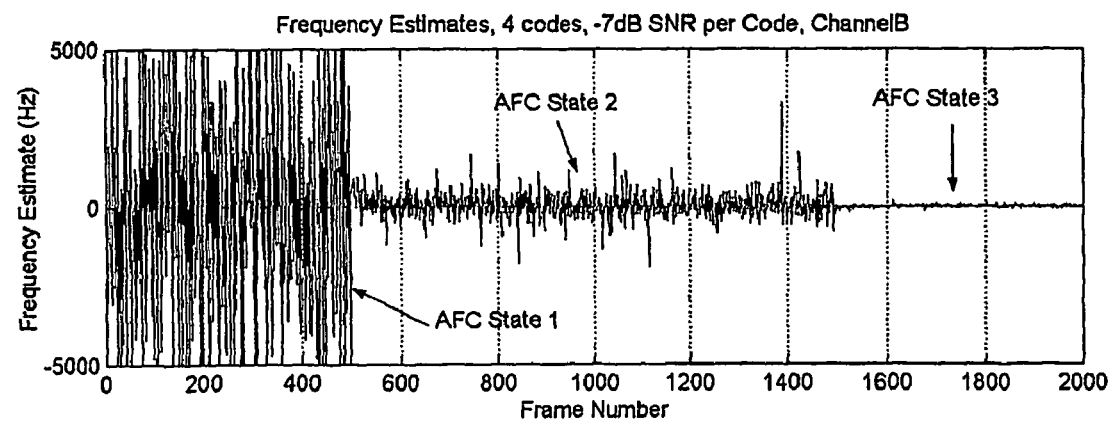
FIG. 8B

METHOD AND ARRANGEMENT FOR AUTOMATIC FREQUENCY CONTROL IN A COMMUNICATION SYSTEM

CROSS-REFERENCE TO RELATED APPLICATIONS

This application is the national phase of PCT application PCT/GB2004/002111 having an international filing date of May 14, 2004, which claims priority from United Kingdom application number GB 0311311.5 filed May 16, 2003. The contents of these documents are incorporated herein by reference.

FIELD OF THE INVENTION

This invention relates to automatic frequency correction (AFC), and particularly to AFC in communication systems.

BACKGROUND OF THE INVENTION

Automatic frequency correction (for carrier phase and symbol synchronisation) is required by all digital communications systems. The following describes briefly prior art techniques commonly used for AFC in digital communications systems.

FIG. 1 shows the generic form of an AFC loop. A received signal is compared to a local signal in a phase detector. The output of the phase detector is converted to a frequency estimate, and this is processed by a loop filter whose output is used to control a local frequency reference. In this example, the AFC loop is implemented in a remote terminal (User Equipment or UE) of a communication system, and the UE frequency reference voltage controlled oscillator (VCO) is driven by an analogue signal from a Digital-to-Analogue converter, the loop filter being implemented in the digital domain (covering both hardware and software implementations). The overall performance of the AFC loop is determined by the accuracy with which frequency errors can be estimated. The loop filter can influence characteristics of the overall loop such as response time and output frequency variance; however, the loop filter can not overcome non-ideal characteristics in the frequency estimator. For example, a frequency estimator with a very high variance may require an impractically narrow loop filter which results in unacceptable response times. Also, if the frequency estimate is biased, the control loop will not tend to zero steady-state error, but will reach a steady state condition with a residual frequency error which can not be removed by any loop filter characteristic.

Known schemes for frequency estimators may be divided into two groups: Pilot Signal and Data-Directed Loops. Examples of both these schemes are briefly discussed below.

Pilot Signal

Pilot signals have characteristics that are known a priori by the receiver, thus enabling the receiver to maximise the detection probability for these signals. Pilot signals can take a number of different forms, examples of which (described briefly below) are: Unmodulated Carrier, Frequency Correction Burst, Pilot Channel and Midamble Sequences.

Unmodulated Carrier

Basic digital communications systems sometimes use an unmodulated carrier transmitted along with the modulated data. A receiver typically employs a phase-locked loop (PLL) which attempts to track the phase of the unmoduated carrier. A narrow bandwidth is required to ensure that the PLL does not attempt to track the modulated data sequence. An unmodulated carrier signal represents a narrow band signal and can not benefit from the advantages of frequency diversity offered by wide-band modulated signals; hence, the use of this technique is cannot be considered for modern wideband communication systems such as wide-band code-division-multiple access (W-CDMA) systems.

Frequency Correction Burst

This technique is similar to the unmodulated carrier technique described above; however, it has been adapted to work within a Time-Division-Multiple-Access (TDMA) system. In this case, the carrier signal is not transmitted continuously, but it is time-multiplexed in a known sequence. By using time-multiplexing, the carrier can be transmitted without modulated data present; hence, improving the frequency estimate for a given carrier power. This technique is used in the GSM mobile system and the frequency correction also doubles up as an initial synchronisation signal since the unmodulated carrier is easy to identify. This technique is still a narrow band solution and not appropriate for wideband modulation systems.

Pilot Channel

A pilot channel signal is transmitted by some CDMA systems. The pilot signal is spread across the full modulation bandwidth in the same method as for the rest of the transmitted data. In general, the amount of transmit power dedicated to the pilot signal is optimised for the system deployment. In typical applications, pilot channels in CDMA systems are transmitted continuously and the pilot is used as a coherent reference for reception of the data.

Midamble Sequences

Midambles are generally transmitted in the centre of the timeslot(s) in TDMA systems. Transmission of the data does not occur at the same time as the transmission of the midamble. The midamble is used as a coherent reference for the reception of the data.

Data-Directed Loops

Unlike pilot signals, data-directed loops use the modulated data to generate the phase estimates. These systems do not require the transmission of pilot signals. These systems fall into two main categories:

Non-Decision-Directed Loops

Non-decision directed loops rely on the statistical average of the received data to generate a phase estimate. Examples of non-decision-directed loops are the 'Squaring Loop' and the 'Costas Loop' used in basic digital modulation systems; these loops are well known, and need not be described further herein.

Decision-Directed Loops

Decision-directed loops rely on the fact that the received data sequence is known. They are often used where hard-decisions are made at the output of the demodulator. This technique is preferred over non-decision-directed loops due to the fact that the phase estimate produced is unbiased and the performance in low signal-to-noise ratios is also superior.

The Time Division Duplex (TDD) version of the 3rd generation Universal Mobile Telecommunications System (UMTS) as specified by the $3^{rd}$ Generation Partnership Project (3GPP) does not provide any specific pilot signals with the explicit purpose of frequency correction. The synchronisation channel SCH was designed to be detectable in the presence of a large frequency offset, and as a result it is possible to use this signal to generate frequency estimates under these conditions. In addition, a midamble is transmitted in the centre of each timeslot and it is possible to use the midamble sequence to further generate frequency estimates.

However, neither of the above schemes can obtain the frequency correction accuracy required to have minimal impact on the error rate of the received data in all channel configurations of a TDD UMTS system.

A need therefore exists for a communication system, method and unit for automatic frequency control therein wherein the abovementioned disadvantage(s) may be alleviated.

STATEMENT OF INVENTION

In accordance with a first aspect of the present invention there is provided a method for automatic frequency control in a communication system as claimed in claim 1.

In accordance with a second aspect of the present invention there is provided an arrangement for automatic frequency control in a communication system as claimed in claim 19.

BRIEF DESCRIPTION OF THE DRAWINGS

One arrangement, method and unit for automatic frequency control in a communication system incorporating the present invention will now be described, by way of example only, with reference to the accompanying drawings, in which:

FIG. 5A and FIG. 5B show constellation patterns at a symbol detector output in the system of FIG. 2 with a frequency error present, under conditions of High SNR and Low SNR respectively;

FIG. 8A and FIG. 8B show graphs illustrating frequency error and AFC performance produced in the system of FIG. 2;

DESCRIPTION OF PREFERRED EMBODIMENT(S)

Figure 2:
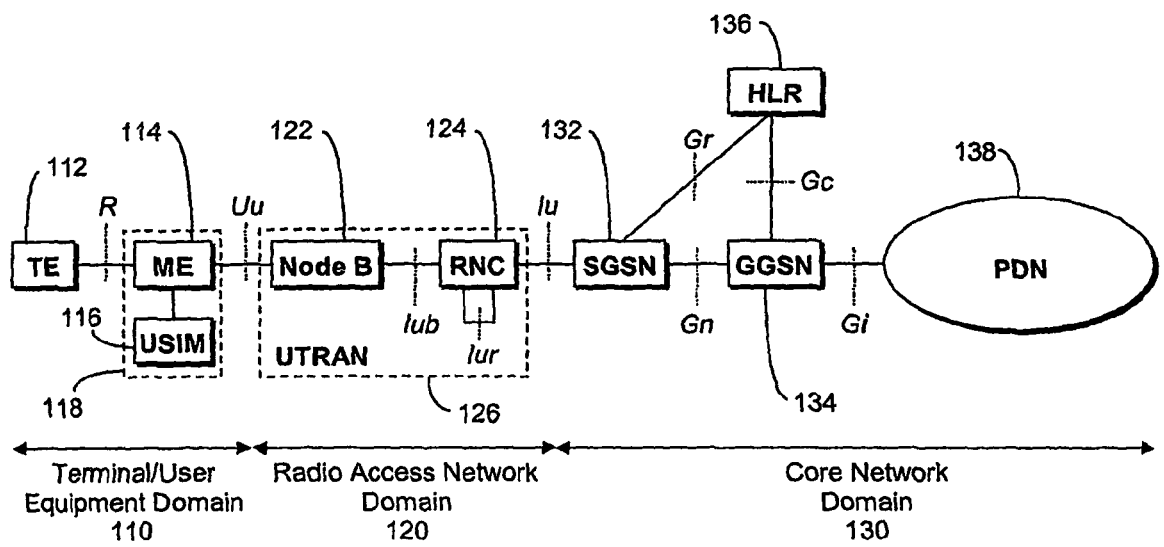
FIG. 2 shows a block schematic diagram illustrating a 3GPP radio communication system in which the present invention may be used.

The following preferred embodiment of the present invention will be described in the context of a UMTS Radio Access Network (UTRAN) system operating in TDD mode. Referring firstly to FIG. 2, a typical, standard UMTS Radio Access Network (UTRAN) system 100 is conveniently considered as comprising: a terminal/user equipment domain 110; a UMTS Terrestrial Radio Access Network domain 120; and a Core Network domain 130.

In the terminal/user equipment domain 110, terminal equipment (TE) 112 is connected to mobile equipment (ME) 114 via the wired or wireless R interface. The ME 114 is also connected to a user service identity module (USIM) 116; the ME 114 and the USIM 116 together are considered as a user equipment (UE) 118. The UE 118 communicates data with a Node B (base station) 122 in the radio access network domain 120 via the wireless Uu interface. Within the radio access network domain 120, the Node B 122 communicates with a radio network controller (RNC) 124 via the Iub interface. The RNC 124 communicates with other RNC's (not shown) via the Iur interface. The Node B 122 and the RNC 124 together form the UTRAN 126. The RNC 124 communicates with a serving GPRS service node (SGSN) 132 in the core network domain 130 via the Iu interface. Within the core network domain 130, the SGSN 132 communicates with a gateway GPRS support node (GGSN) 134 via the Gn interface; the SGSN 132 and the GGSN 134 communicate with a home location register (HLR) server 136 via the Gr interface and the Gc interface respectively. The GGSN 134 communicates with public data network 138 via the Gi interface.

Thus, the elements RNC 124, SGSN 132 and GGSN 134 are conventionally provided as discrete and separate units (on their own respective software/hardware platforms) divided across the radio access network domain 120 and the core network domain 130, as shown the FIG. 2.

The RNC 124 is the UTRAN element responsible for the control and allocation of resources for numerous Node B's 122; typically 50 to 100 Node B's may be controlled by one RNC. The RNC also provides reliable delivery of user traffic over the air interfaces. RNC's communicate with each other (via the Iur interface) to support handover and macrodiversity.

The SGSN 132 is the UMTS Core Network element responsible for Session Control and interface to the HLR. The SGSN keeps track of the location of an individual UE and performs security functions and access control. The SGSN is a large centralised controller for many RNCs.

The GGSN 134 is the UMTS Core Network element responsible for concentrating and tunnelling user data within the core packet network to the ultimate destination (e.g., internet service provider—ISP).

Such a UTRAN system and its operation are described more fully in the 3GPP technical specification documents 3GPP TS 25.401, 3GPP TS 23.060, and related documents, available from the 3GPP website at www.3gpp.org, and need not be described in more detail herein.

In wireless communications systems it is necessary to provide a means by which the timing reference in the remote terminal (for example, the UE 118) can be synchronised with the timing reference in the base station (for example, the Node B 122).

Furthermore it is assumed that the timing reference of the mobile system is defined by the network elements, and it is the responsibility of the remote terminals (the UE 118), to adapt their timing references to align with the timing reference and absolute radio frequency used by the network infrastructure base stations (the Node B 122).

It is not feasible to manufacture UE terminals with the very high inherent frequency accuracy that is required for the wireless communication system to achieve its optimal performance. Typically, the required frequency error is of the order of $10^{-7}$ to $10^{-8}$ times the carrier frequency, which is 1 to 2 orders of magnitude lower than is currently considered to be the limit of the standard frequency reference used in UE terminals.

It is therefore necessary for the UE to be able to automatically adjust its frequency reference in order to bring its operating frequency within specification. This process is known as Automatic Frequency Correction (AFC). In order to implement an AFC scheme, a reference signal must be available that can be used to generate estimates of the frequency error and hence use these frequency error estimates to derive a corrective signal as part of a feedback loop.

The Time Division Duplex (TDD) version of the 3$^{rd}$ generation UMTS as specified by 3GPP does not provide any specific pilot signals with the explicit purpose of frequency correction.

The synchronisation channel, SCH was designed to be detectable in the presence of a large frequency offset, and as a result it is possible to use this signal to generate frequency estimates. In addition, a midamble is transmitted in the centre of each timeslot and it is possible to use the midamble sequence to further generate frequency estimates.

In the design of the TDD system, the assumption has been made that the radio channel is quasi-static across the length of one timeslot (666 μs). However, it is not valid to assume that the radio channel is static across a longer time than this. The TDD standard only caters for only 1 or 2 beacon slots per 10 ms (15 timeslots) frame; therefore, there are only one or two timeslots that are guaranteed to be active in any one frame. Even in the case of 2 beacon slots per frame, the beacon slots are separated by at least 7 slots. This means that it is not valid to assume a quasi-static channel across the time interval separating beacon transmissions. Therefore, it is not possible to compare channel estimations from consecutive beacon transmissions, since it is not possible to distinguish between changes due to frequency offset and changes due to the non-stationary channel. This argument also extends to the SCH since this is also transmitted in beacon slots.

If the SCH or the midamble is to be used for frequency estimation, then a frequency estimate must be obtained from a single midamble or SCH. Frequency estimates can be generated from any known sequence by splitting the received sequence in half and correlating the two halves separately with the local replicas of the transmitted sequences, these are referred to as 'partial correlations' (it will, of course, be understood that the received sequence may more generally be split into portions other than half). The phase difference between these two partial correlations is calculated and a frequency offset is generated by dividing the phase difference by the time interval separating the two partial correlations. This is described mathematically below:

$$P_1 = \sum_{i=i_1}^{i_2} r_i x_i^*$$

$$P_2 = \sum_{i=i_3}^{i_4} r_i x_i^*$$

$$\hat{f} = \frac{1}{t_3 - t_1} \tan^{-1}\left(\frac{\text{Im}(P_2 P_1^*)}{\text{Re}(P_2 P_1^*)}\right)$$

where $r_i$ is the i$^{th}$ sample of the received midamble or SCH sequence, $x_i$ is the local copy of the appropriate midamble or SCH sequence, $i_1$, $i_2$, $i_3$, $i_4$ are the start and stop samples for the first and second halves of the sequence, $P_1$ is the first partial correlation and $P_2$ is the second partial correlation, $t_1$ and $t_3$ are the times corresponding to the start samples of the two partial correlations and $\hat{f}$ is the resulting frequency estimate.

For frequency estimates calculated on both SCH and midamble sequences, the term $t_3-t_1$ is relatively small, which leads to a relatively high variance in the frequency estimate for an otherwise acceptable variance in phase estimate.

Due to the high variance in the frequency estimate, it is necessary to filter the frequency estimate calculated across many bursts, which leads to an AFC control loop with a very long response time. Also, as the averaged phase estimate resolution required to obtain the necessary frequency accuracy is very small, the AFC loop is sensitive to small bias terms introduced by the use of fixed sequences coupled with non-ideal reception (e.g., multi-path).

Generally, frequency estimates calculated from the midamble are more accurate than estimates calculated from the SCH. The SCH is transmitted simultaneously with the modulated data, and therefore the signal-to-noise ratio of the SCH is lower than that of the midamble sequence which is transmitted on its own. In addition, the local copy of the midamble can be reconstructed with information obtained from the channel estimate, and therefore channel impairments such as multi-path can be compensated for with greater effect.

However, neither of the above schemes can provide the frequency correction accuracy required to have minimal impact on the error rate of the received data in all channel configurations. Therefore, an additional method of frequency estimation is required.

As will be explained in greater detail below, the present invention is based on use of the received data itself to generate the frequency error. In particular, this preferred embodiment uses a Decision-Directed Loop with CRC (Cyclic Redundancy Check) which allows frequency estimates to be calculated from the modulated data itself with the knowledge that the data sequence was received correctly. In UMTS, the air interface Uu uses transport channels to carry data (arranged into transport blocks) over the air interface; physical channels are the means by which the transport channels are actually transmitted over the radio link. Using this nomenclature, data sequences are tested for correct reception at the transport block level rather than the physical level.

In practice, in a full AFC system, the decision-directed loop is responsible for the final frequency accuracy only. It can not correct very large frequency offsets as these can cause channel errors high enough to cause FEC (Forward Error Correction) to fail, resulting in a catastrophic failure of the decision-directed loop.

It is necessary to combine the decision-directed loop with other frequency estimates derived from more conventional techniques such as frequency estimation from the SCH or midamble sequences, resulting in multi-stage AFC.

Auxiliary Frequency Estimates for Initial Acquisition

When the UE is first initialised, it is possible for a large frequency error to be present. It is perfectly reasonable to assume that this frequency offset could be large enough to prevent the correct detection of transport channel data. It is necessary to make use of auxiliary frequency estimates that do not rely on the correct detection of data in the initial stages of the AFC process.

UTRA TDD mode does not provide a reference signal exclusively for frequency correction. It does provide other signals such as the SCH which are designed to be detectable in conditions of high frequency error. It is possible to use this signal to remove the very large frequency offsets anticipated at UE initialisation as discussed above.

Following the completion of the initial synchronisation process, the UE has knowledge of the midamble sequence transmitted by the base station, and hence frequency estimates from the midamble can be used in the AFC process.

The requirement on the performance of the AFC loop based on frequency estimates from the SCH is such that the frequency error needs to be reduced to a level that permits the detection of the midamble sequence with minimal degradation in detection probability.

The requirement of the AFC loop based on frequency estimates from the midamble is such that the frequency error must be reduced to a level that permits the successful reception of data carried on the P-CCPCH (Primary Common Control Physical CHannel) such that the BCH (Broadcast CHannel)transport channel is received with an acceptable degradation in block error rate.

Figure 3:
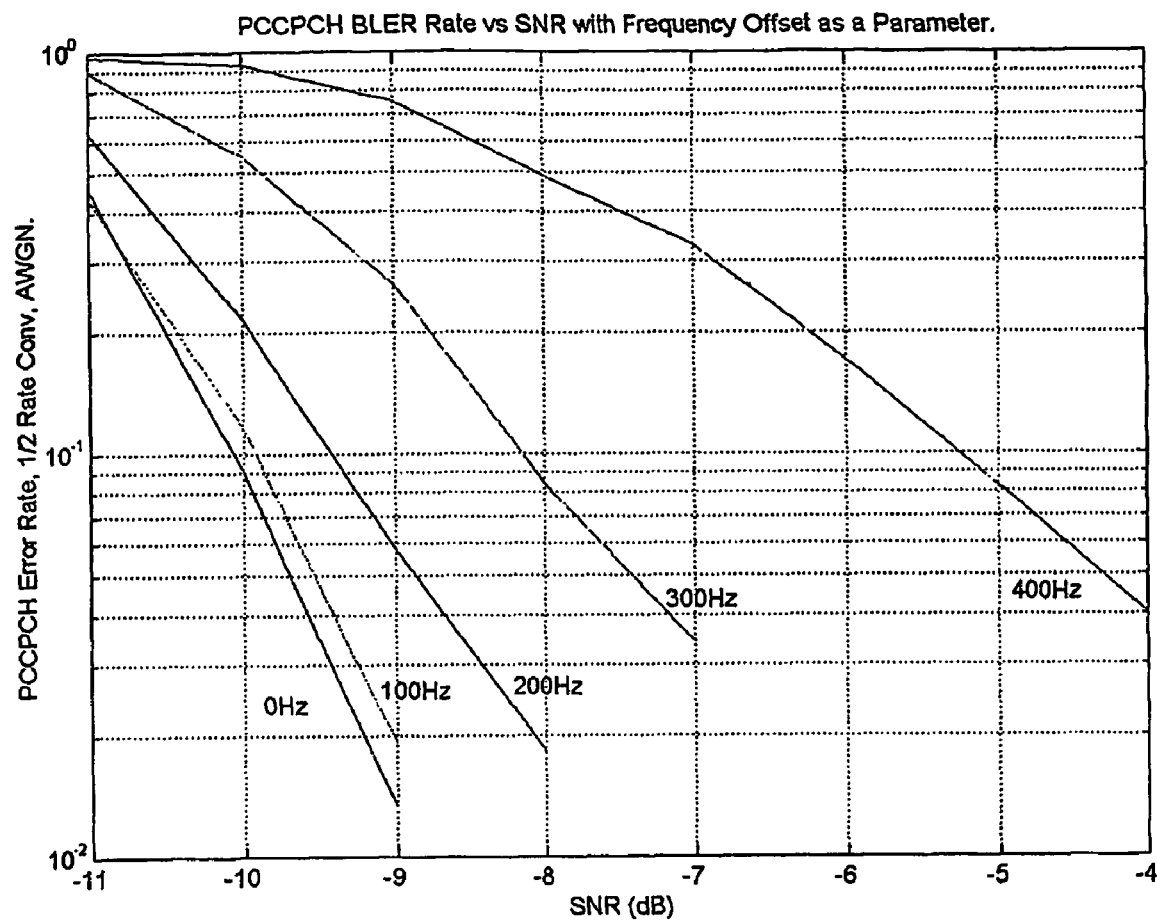
FIG. 3 shows a graph illustrating an example, in use of the system of FIG. 2, of P-CCPCH ((Primary Common Control Physical CHannel) BCH (Broadcast CHannel) Block Error Rate (BLER) versus signal-to-noise ratio (SNR) with Frequency Offset as a Parameter.

It may be noted that this preferred embodiment does not specify the nature of the auxiliary frequency estimates. It is just assumed that some mechanism of adjusting the frequency of the UE exists that is sufficiently accurate to ensure that the BCH transport channel can be decoded, even if this is with a relatively high block error rate. FIG. 3 shows an example of the degradation of the BCH transport channel block error rate (carried on P-CCPCH) with frequency error. It can be seen that the block error rate (BLER) degrades rapidly with increasing frequency offset, BLER's being shown for frequency offsets ranging from 0 Hz to 400 Hz.

CRC-Decision Directed Frequency Estimate

In decision-directed loops, the received data sequence is known, and this information is used to construct a local copy of the received signal. Frequency offsets can be estimated by comparing two portions of the received data symbols with their corresponding locally generated replicas.

Figure 4:
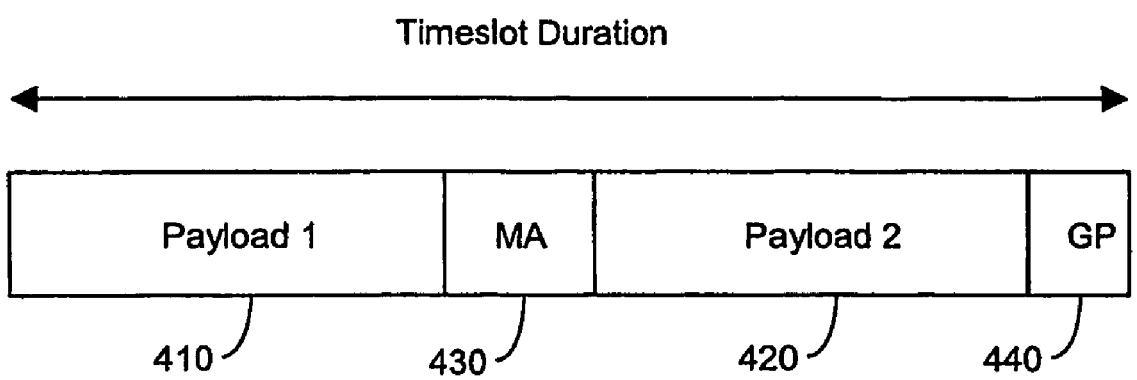
FIG. 4 shows a block diagram illustrating a Timeslot Structure used in the system of FIG. 2.

As illustrated in FIG. 4, in UTRA TDD mode, each time slot 400 consists of two data payloads 410 and 420 separated by a midamble 430 and concludes with a guard portion 440. It is convenient to use each payload as an individual correlation sequence and calculate the frequency estimate from the phase difference calculated between the two payloads.

Using the full part of both data payloads gives superior frequency estimator performance for two main reasons: Firstly, the correlations are calculated over the full payload length, hence the variance of the phase estimate for each payload benefits from the increased averaging when compared with either the SCH or the midamble partial correlations (the payload section is approximately 4 times longer than the partial correlations used on the midamble frequency estimator). Secondly, the time difference between the two payloads is more than 6 times larger than that in the midamble frequency estimator which reduces the variance transferred from the phase estimates to the frequency estimator.

As mentioned above, decision-directed loops require that the data symbol sequence at the physical channel level is known. If the signal-to-noise ratio of the received signal is high, then hard decisions made at the detector output can be used to obtain the received data symbols. However, in low signal-to-noise ratio conditions, the raw channel bit error rate (based on hard decisions) can be quite high, leading to an unknown received symbol sequence.

FIG. 5 shows an example of symbol detector output for a modulation scheme using QPSK (Quadrature Phase Shift Key) modulation under conditions of high and low signal-to-noise ratio (although it may be noted that this invention is not restricted to using QPSK). In the high signal-to-noise ratio case shown in FIG. 5A, the constellation points have been spread over an arc (due to the presence of a frequency offset term); however the data points are still easy to determine. In the low signal-to-noise ratio case shown in FIG. 5B, the constellation points are not easily identifiable at the output of the detector. Further processing on the received data is required in order to identify the correct bit sequence. This functionality is provided by Forward Error Correction (FEC) applied to the data as part of the known transport channel processing.

Transport channel processing is the procedure used by the physical layer to map the data in the transport block to the physical channel data symbols transmitted over the air interface. Transport channel processing is a sequence of procedures such as channel coding, interleaving, scrambling rate matching and multiplexing which are applied to the transport block data. It is defined as part of the UMTS 3GPP standards, and its exact implementation is not part of this invention and need not be described further herein.

Part of the transport channel processing also includes a Cyclic-Redundancy-Check (CRC) attachment. This is a check-sum which is added to the data sequence and which is used in the receiver to indicate the reception of a valid transport block. Transport blocks that pass the CRC check are known to have a very high probability of being correct and therefore the data sequence can be used in the decision-directed loop.

Figure 6:
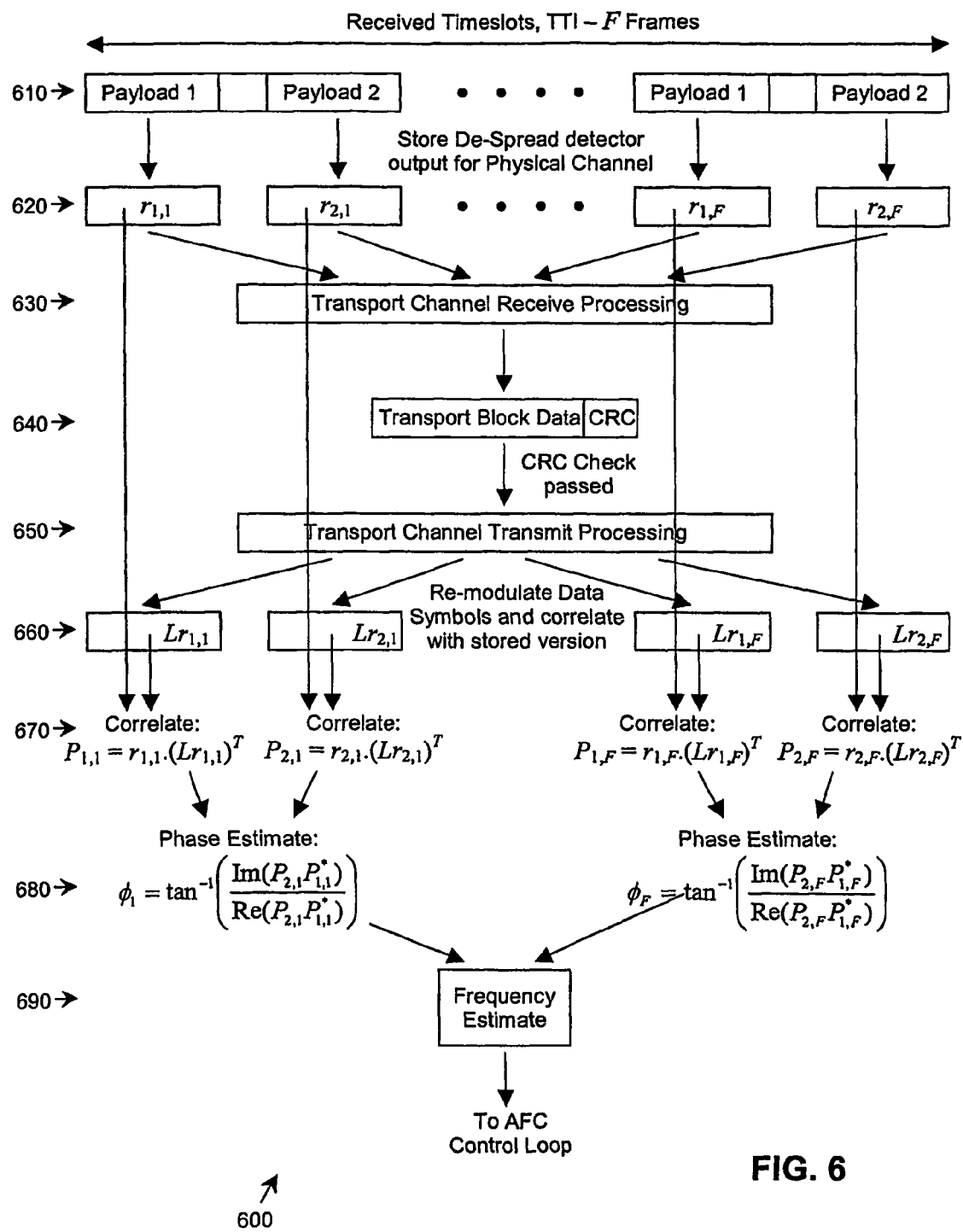
FIG. 6 shows a block-schematic diagram illustrating derivation of a Decision-Directed Frequency Estimate in the system of FIG. 2.

In UTRA, the CRC check is performed at the transport block level, and therefore the full receive transport channel processing needs to be performed before the CRC check can be attempted. If a valid CRC is obtained, then the data can be re-processed by the transmit transport channel processing to obtain the correct data symbols which can then be compared to the received data symbols at the output of the detector. FIG. 6 shows this basic process 600.

As can be seen from FIG. 6, at step 610 the timeslots carrying the transport block data are received over a transmission time interval (TTI) of F radio frames. At step 620 the receiver stores the data symbols on the appropriate channelisation codes of all the timeslots transmitted in the full TTI for the transport format applied to the transport block. At steps 630 and 640 the receiver performs the appropriate receive transport channel processing needed to extract the transport block data sequence and the CRC attachment. If a CRC pass is obtained, then at step 650 the transport block is processed by the transmit version of the transport channel processing using the same transport format. This results at step 660 in the reconstruction of the ideal data symbols expected at the output of the receive detector. Each timeslot in the TTI has two data payloads for each channelisation code used in the physical channel.

At step 670 the re-modulated data symbols are correlated with the stored data symbols and the phase relative between the two payloads for all timeslots and channelisation codes in the TTI is generated at step 680. At step 690 these phase estimates are averaged across the TTI and converted to a frequency estimate which is passed to the AFC control loop.

Control Loop

The control loop is responsible for adjusting the frequency of the receiver reference oscillator and for defining the response characteristics of the AFC process. The control loop also determines the source of the AFC frequency estimates.

Figure 7:
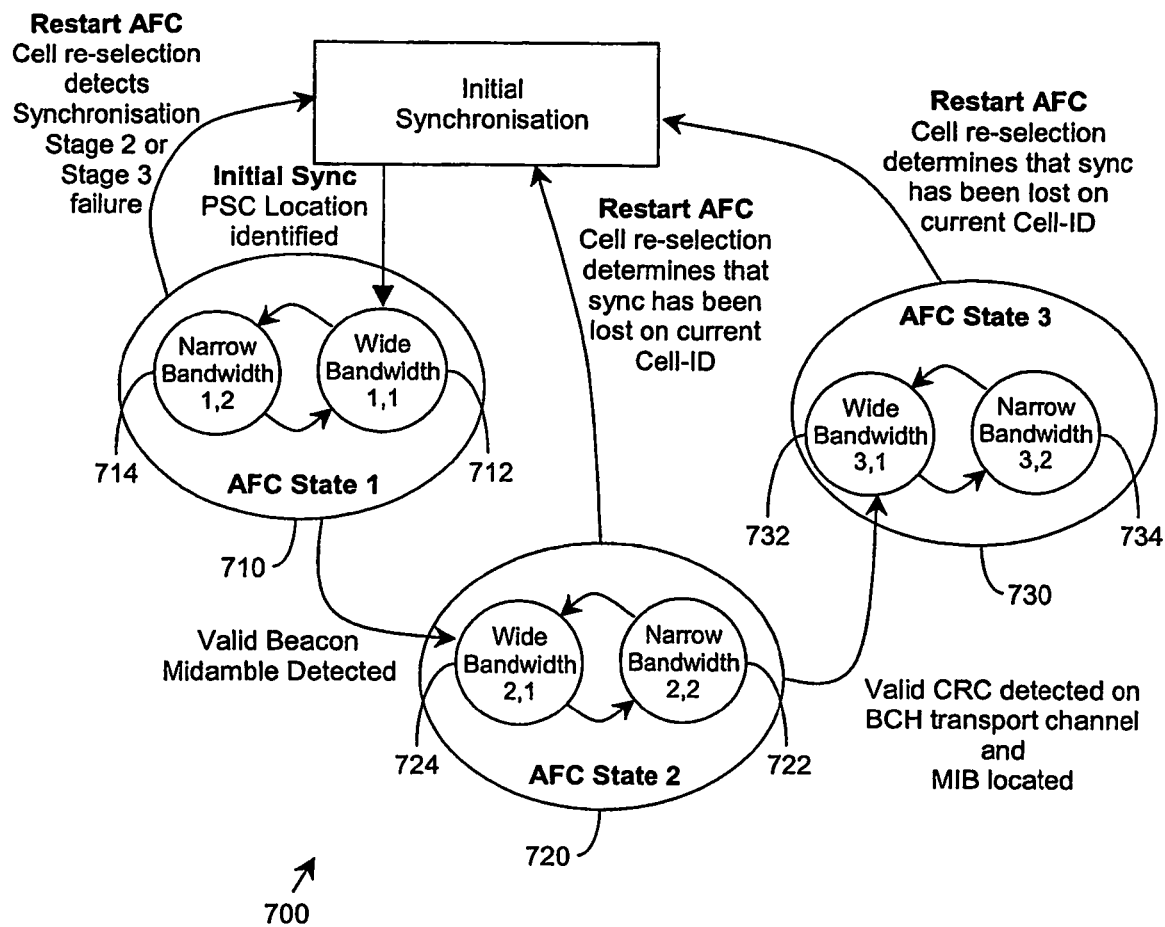
FIG. 7 shows a State Diagram of an AFC Control Loop in the system of FIG. 2.

A state-diagram detailing the operation of the AFC loop is shown in FIG. 7 (it may be noted that this diagram refers to the specific example where the auxiliary frequency estimates are generated by the SCH and the midamble). The AFC process 700 comprises 3 states, each state corresponding to a specific source of the frequency estimates:

In AFC State 1 (710), frequency estimates are derived from the SCH;

In AFC State 2 (720) the midamble is used to estimate the frequency error; and

In AFC State 3 (730) the frequency estimates are calculated using the CRC-decision-directed process.

Each AFC State can have sub-states (712, 714; 722, 724; 732, 734) which correspond to different control loop bandwidths, whilst in any given AFC State the control loop can transition between the associated sub-states (and hence transition between bandwidths). By switching bandwidths, the control loop can optimise the trade-off between response time and the variance in the closed-loop frequency error. By selecting a wide bandwidth (712; 722; 732) upon entry to the AFC State, a fast response time is achieved. Switching to a narrower bandwidth (714; 724; 734) once the loop has reached its steady-state error will reduce the variance at the output of the loop. The parameters that control the selection of the sub-states can be based on criteria such as metrics derived from the averaged frequency error, timers determining the length of time spent in each state or some other metric supplied by a process external to the AFC process.

The AFC process is initiated by the initial synchronization process 705 in the UE. The initial synchronization process must have first identified the presence of a SCH signal, which provides PSC location, before the AFC process can begin. The AFC process will remain in State 1 until a valid beacon midamble has been detected by the initial cell search process in the UE. If, during State 1, cell re-selection detects failure of known (e.g., from 3GPP Technical Specification TS25.224, Annex C) synchronisation Stage 2 or Stage 3, the AFC loop is re-started by returning to the initial synchronisation stage 705.

When in State 2, the midamble in received timeslots is used as the frequency estimate. State 2 is maintained until the location of the BCH transport channels has been found. To do this, the UE continues to decode the beacon channel assuming all the slots are to be processed with the BCH transport format. Eventually, the UE will decode a transport block that corresponds to the System Information Master Information Block (MIB) which will inform the UE of the locations of the P-CCPCH physical channels that carry the BCH transport block transmissions. If, during State 2, cell re-selection determines that syncrhronisation has been lost on the current cell-ID, the AFC loop is re-started by returning to the initial synchronisation stage 705.

Once the locations of the P-CCPCH channels are known, the physical layer processing can be set up accordingly and AFC State 3 can begin. If, during State 3, cell re-selection determines that syncrhronisation has been lost on the current cell-ID, the AFC loop is re-started by returning to the initial synchronisation stage 705.

FIG. 8 shows the performance obtained for the complete AFC loop 700; both resultant frequency error (FIG. 8A) and frequency estimates (FIG. 8B) used to drive the control loop are shown. In this case, AFC State 1 corresponds to SCH based frequency estimates, AFC State 2 corresponds to midamble based frequency estimates and AFC State 3 shows the case for CRC-decision-directed frequency estimation.

It is clear from FIG. 8 that the SCH frequency estimate (AFC State 1) is by far the worst performer, the variance in the frequency estimate is very large and the net frequency of the AFC process shows a bias of about 500 Hz. Also, the variance of the complete loop (frequency jitter) is quite high.

The midamble frequency estimate (AFC State 2) is much better, both in terms of frequency estimate variance, steady state bias and frequency jitter. However, a bias term is still evident.

The CRC-decision-directed case (AFC State 3) is superior in all aspects.

The preferred embodiment of the present invention is described in greater detail below.

Auxiliary Frequency Estimates

It is a requirement that the frequency error is reduced to an acceptable level that permits the correct reception of BCH transport blocks before the decision-directed frequency estimates can be used to drive the final accuracy of the loop.

As explained above, in the preferred embodiment, auxiliary frequency estimates are used to drive the initial large frequency errors that may be encountered during UE initialisation and these auxiliary frequency estimates are first obtained from the SCH during the first stages of UE synchronisation, and then from the midamble on beacon slots during the final stages of initialisation.

For both of these frequency estimates, partial correlations are used to calculate the frequency estimate as described above (for example, in relation to FIG. 6).

Use of BCH Transport Channel

UTRA offers a plurality of transport channels which can be used to carry data blocks (transport blocks) over the air interface. The characteristics of the transport channels are determined by their transport format (or format combination) which defines the physical layer processing (e.g., type of channel coding, interleaving, service specific rate-matching, TTI, etc.) to be applied to the transport channel.

It is possible to use all received data timeslots in the computation of frequency estimates; however, in order to minimise the complexity, a single transport channel and transport format may be used. The BCH transport channel (and the transport format it uses) is fixed and known a priori by the receiver. This is because the BCH transport channel carries the system information that the UE must read before it can communicate with the UTRAN.

In addition, the use of the BCH transport channel further minimises complexity, as the BCH transport channel is always carried by the P-CCPCH physical channel which has known fixed characteristics (e.g., burst type 1, channelisation code 1, spreading factor 16 only transmitted on beacon timeslot k).

Although the P-CCPCH is only ever transmitted on the first beacon slot present in the radio frame, the converse is not true—i.e., other physical common channels can be mapped to beacon slots. The locations of P-CCPCHs within a multi-frame cycle are signaled as part of the system information. Therefore, it is necessary for the UE to read the system information and inform the physical layer processing block of the location of the P-CCPCH time slots.

Storage of P-CCPCH Data Symbols

The physical layer processing is informed by higher layers of the location of P-CCPCH physical channels. The physical layer processing then stores the received data symbols at the output of the receiver detector that correspond to P-CCPCH timeslots and channelisation code(s). In the preferred embodiment, the detector corresponds to a multi-user detector and as such the data symbols output therefrom have been equalised and de-spread, hence the data stored are complex symbols rather than chips. By storing data symbols, the total storage is reduced.

The P-CCPCH is transmitted with a TTI of 2 frames; therefore, both timeslots in the TTI must be stored. It may be noted that the data symbols are stored at the full resolution of the detector output—typically 10 bits, rather than the quantised version (soft metrics) that may be used for the rest of the receiver function, which is generally a much lower resolution—typically 3 or 4 bits.

Receiver Transport Channel Processing

The transport channel processing for the BCH transport format needs to be completed before the received data sequence is known. If the BCH transport block is received and the CRC check fails, then the stored P-CCPCH data symbols can be discarded as the received data sequence is known to be incorrect.

Transmit Transport Channel Processing

If the CRC check passes, the received transport block data is known with a sufficiently high probability and the ideal received data symbols can be regenerated by passing the BCH transport block through the transmit transport channel processing for the BCH transport format and by obtaining the complex data symbols before spreading.

If the CRC check fails, then the data is not processed and a frequency estimate is not produced. It will be appreciated that the performance of the AFC process is not adversely affected by CRC failures. Extensive simulations have shown that the frequency correction ability of the AFC loop is still adequate even with transport block CRC failure rates as high as 75%. This is because no error term is introduced into the loop in the case of a CRC failure, the operation of the loop being effectively suspended until the next frequency estimate is generated. This leads to an effective change in the update rate of the control loop, resulting in increased acquisition time which is more acceptable than the effect of introducing frequency estimates calculated from invalid data sequences into the loop.

CRC-Decision Directed Frequency Estimate

The received data symbols and re-modulated data symbols are separated into the payloads that correspond to the burst structure from each timeslot in the TTI. Absolute phase estimates are then computed for each payload by correlating the received data symbols with the re-modulated data symbols. The relative phase offset between the payloads in each timeslot is then calculated.

A frequency estimate for each timeslot is calculated by dividing the relative phase between the payload correlations by the time difference between the start of each payload. The frequency estimates from all timeslots in the TTI are averaged to give a net frequency estimate obtained from the BCH transport block. This estimate is passed to the AFC control loop.

AFC Control Loop

Figure 1:
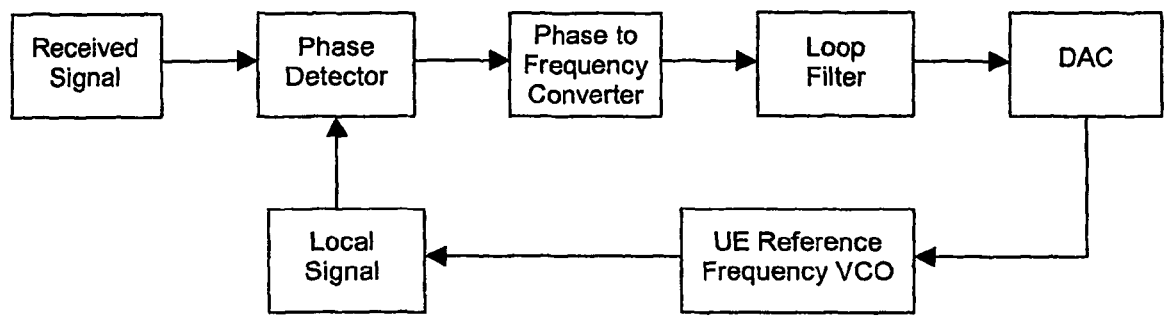
FIG. 1 shows a block schematic diagram of a generic, known form of AFC control loop.
Figure 9:
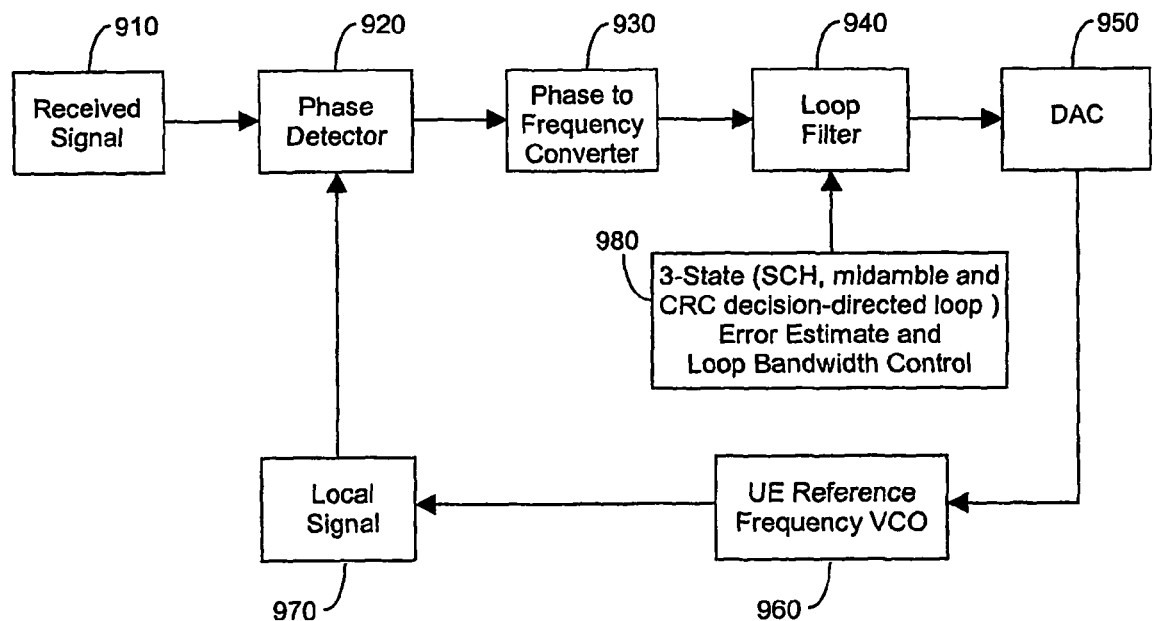
FIG. 9 shows a block-schematic diagram of an example practical AFC Control Loop implementation in the system of FIG. 2.

Referring also to FIG. 9, the AFC control loop of the preferred embodiment consists of an otherwise-conventional closed-loop feedback system (similar to that of FIG. 1), in which a received signal 910 is input to one input of a phase detector 920, whose output is applied via a phase-to-frequency converter 930 to a loop filter 940. The loop filter output is applied via a digital-to-analog converter 950 to a reference frequency VCO 960 of the UE. The VCO output is applied to a local signal generator 970, whose output is applied to another input of the phase detector 920. As explained above, a control block 980 provides a 3-State error estimate (SCH, midamble and CRC decision-directed loop) to, and controls the loop bandwidth (wide or narrow) via the loop filter 940. The loop filter 940 in the feedback loop determines the response time and the level of frequency variance in the frequency offset. As the multi-frame rate of the P-CCPCH transmissions is signaled by higher layers, the loop filter can be optimised to balance the conflicting requirements of response time and frequency jitter.

The variance is a function of the effective number of frequency estimates that are averaged by the control loop. Narrow loop bandwidths correspond to a large number of effective averages, and give rise to a longer settling time. Wide loop bandwidths correspond to a small number of effective averages and result in a shorter settling time, but increase the frequency jitter.

Figure 10:
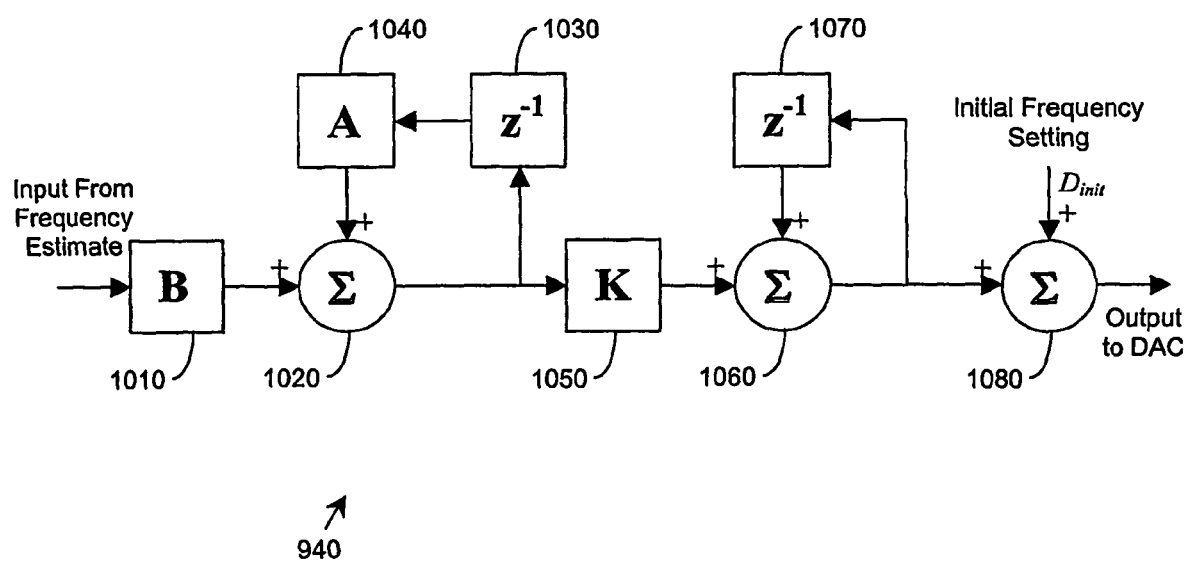
FIG. 10 shows a block-schematic diagram illustrating in greater detail the loop filter of the AFC Control Loop of FIG. 9.

An example of the implementation of a control loop filter 940 is shown in FIG. 10. The frequency estimate (derived as explained above) is input to a multiplier 1010 (for multiplying by a parameter B), whose output is applied to a summation element 1020. The output of the summation element 1020 is applied via a delay 1030 and a multiplier 1040 (for multiplying by a parameter A) to another input of the summation element 1020. It may be noted that the configuration of 1010, 1020, 1030 and 1040 forms an elementary Infinite Impulse Response (IIR) filter. The output of the summation element 1020 is also applied via a multiplier 1050 (for multiplying by a parameter K) to an input of a summation element 1060. The output of the summation element 1020 is applied via a delay 1070 to another input of the summation element 1060. The output of the summation element 1060 is also applied to an input of a summation element 1080, another input of which receives an initial frequency setting $D_{init}$. The output of the summation element 1080 is applied to the DAC 950.

The parameters A, B and K can be varied to effect a change in the bandwidth of the control loop. In normal use parameters A and K are used to control the characteristics of the loop filter. The parameter B is used to compensate for changes in external characteristics—e.g., reference oscillator characteristics or RF frequency. This allows the loop parameters A and K to be independent of external influences and hence to remain constant for different applications of the filter.

Support of DRX

It should be noted that the preferred embodiment also provides support for the optional use of discontinuous reception (DRX) at the UE. In UTRA, a connection state is defined (e.g., Idle Mode, Cell_PCH/URA_PCH, Cell_FACH or Cell_DCH). Each connection state has different requirements in terms of the minimum level of UE receiver activity. Increasing receiver inactivity (DRX) obviously extends battery life, but it can have an impact on the performance of the some UE processes—AFC is one of these processes.

The variance of the frequency estimates obtained from the decision directed loop is sufficient to require a relatively small number of averages across frames to reach the specified frequency accuracy and jitter targets. This means that a relatively wide loop bandwidth can be employed, and as a consequence the AFC can maintain a satisfactory frequency error performance even with relatively few updates per second (as is the case for DRX).

It will be appreciated that the process for AFC control described above will typically be carried out in software running on a processor (not shown), and that the software may be provided as a computer program element carried on any suitable data carrier (not shown) such as a magnetic or optical computer disc. It will also be appreciated that the AFC control loop described above may alternatively be fabricated in an integrated circuit for use in a terminal of a communication system.

It will be appreciated that although the AFC control loop has been described above in the context of a UE for use in a UTRA TDD system, the invention is not limited to such an application and may be used in communication systems generally.

It will be understood that the communication system, method and unit for automatic frequency control therein described above provides the advantage of allowing required frequency correction accuracy to have minimal impact on the error rate of the received data in a variety of channel configurations.

The invention claimed is:

1. A method for automatic frequency control (AFC) in a communication system, the method comprising:
at a controller:
producing a decision-directed frequency estimate from a received signal, the step of producing the decision-directed frequency estimate comprising:
reconstructing a copy of an expected value, from the received signal;
detecting, from the received signal, a value corresponding to the reconstructed expected value; and
producing the frequency estimate from the reconstructed expected value and the detected value;
providing an AFC loop receiving the decision directed frequency estimate and performing therewith frequency control.

2. The method of claim 1 wherein the decision-directed frequency estimate is a cyclic redundancy check (CRC) decision-directed frequency estimate.

3. The method of claim 1 wherein the step of producing comprises correlating, and producing the frequency estimate from the result of the correlation.

4. The method of claim 3 wherein the step of correlating comprises performing a plurality of partial correlations to produce a plurality of partial correlation results and combining the plurality of partial correlation results to produce the frequency estimate.

5. The method of claim 1 wherein the method is performed firstly at a relatively wide bandwidth to enhance response time and secondly at a relatively narrow bandwidth to reduce variance.

6. The method of claim 1 wherein the communication system is a UTRAN system and wherein the method is preceded by an auxiliary AFC stage in which frequency estimation is based on a received synchronization channel (SCH) signal.

7. The method of claim 1 wherein the communication system is a UTRAN TDD system and wherein the method is preceded by an auxiliary AFC stage in which frequency estimation is based on received midamble detection.

8. The method of claim 7 wherein the auxiliary AFC stage in which frequency estimation is based on received midamble detection follows another auxiliary AFC stage in which frequency estimation is based on a received SCH signal.

9. The method of claim 1 wherein the communication system is a UTRAN system and wherein the received signal is comprised in a single transport channel.

10. The method of claim 9 wherein the single transport channel is a broadcast channel (BCH).

11. The method of claim 1 wherein the system is a code division multiple access (CDMA) system comprising a multi-user detector and wherein the value corresponding to the reconstructed expected value is a complex symbol which is stored from an output of the multi-user detector.

12. The method of claim 1 wherein the detected value is a digital data symbol which is stored at full resolution from a detector output.

13. The method of claim 1 wherein the method is performed during discontinuous system operation.

14. The method of claim 1 wherein the system is a UMTS system.

15. The method of claim 14 wherein the UMTS system is a UTRAN system.

16. The method of claim 1 further comprising controlling characteristics of a loop filter substantially independently of compensation of the loop filter for external characteristics.

17. The method of claim 1 performed in a user terminal of the system.

18. A computer program element comprising computer program means for performing substantially the method of claim 1.

19. An arrangement for automatic frequency control (AFC) in a communication system, the arrangement comprising:
a frequency estimator configured to produce a decision directed frequency estimate from a received signal by:
reconstructing a copy of an expected value from a received signal;
detecting, from the received signal, a value corresponding to the reconstructed expected value; and
producing the frequency estimate from the reconstructed expected value and the detected value;
an AFC loop arranged for receiving the decision directed frequency estimate and for performing therewith frequency control.

20. The arrangement of claim 19 wherein the decision directed frequency estimate is a cyclic redundancy check (CRC) decision-directed frequency estimate.

21. The arrangement of claim 19 wherein the frequency estimator is further configured to correlate the reconstructed expected value and the detected value, and to produce the frequency estimate from the result of the correlation.

22. The arrangement of claim 21 wherein the frequency estimator is further configured to correlate the reconstructed expected value and the detected value by performing a plurality of partial correlations to produce a plurality of partial correlation results and by combining the plurality of partial correlation results to produce the frequency estimate.

23. The arrangement of claim 19 wherein the arrangement is arranged to perform firstly at a relatively wide bandwidth to enhance response time and secondly at a relatively narrow bandwidth to reduce variance.

24. The arrangement of claim 19 wherein the communication system is a UTRAN system and wherein the arrangement is arranged to perform as a preceding auxiliary AFC stage in which frequency estimation is based on a received synchronisation channel (SCH) signal.

25. The arrangement of claim 19 wherein the communication system is a UTRAN TDD system and wherein the arrangement is arranged to perform as a preceding auxiliary AFC stage in which frequency estimation is based on received midamble detection.

26. The arrangement of claim 25 wherein the performance of the arrangement as the auxiliary AFC stage in which frequency estimation is based on received midamble detection is arranged to follow performance of the arrangement as another auxiliary AFC stage in which frequency estimation is based on a received SCH signal.

27. The arrangement of claim 19 wherein the communication system is a UTRAN system and wherein the received signal is comprised in a single transport channel.

28. The arrangement of claim 27 wherein the single transport channel is a broadcast channel (BCH).

29. The arrangement of claim 19 wherein the system is a code division multiple access (CDMA) system comprising a multi-user detector producing the value corresponding to the reconstructed expected value as a complex symbol and wherein the arrangement further comprises storage means storing the complex symbol value from an output of the multi-user detector.

30. The arrangement of claim 19 wherein the detected value is a digital data symbol and the arrangement further comprises means for storing the digital data symbol value at full resolution from a detector output.

31. The arrangement of claim 19 wherein the arrangement is arranged to perform during discontinuous system operation.

32. The arrangement of claim 19 wherein the system is a UMTS system.

33. The arrangement of claim 32 wherein the UMTS system is a UTRAN system.

34. The arrangement of claim 19 further comprising a loop filter and means for controlling characteristics of the loop filter substantially independently of compensation of the loop filter for external characteristics.

35. A user terminal of a communication system, the user terminal comprising the arrangement of claim 19.

36. An integrated circuit comprising substantially the arrangement of claim 19.

* * * * *

UNITED STATES PATENT AND TRADEMARK OFFICE
CERTIFICATE OF CORRECTION

| | | |
|---|---|---|
| PATENT NO. | : 8,014,475 B2 | Page 1 of 1 |
| APPLICATION NO. | : 10/556560 | |
| DATED | : September 6, 2011 | |
| INVENTOR(S) | : Paul Howard | |

It is certified that error appears in the above-identified patent and that said Letters Patent is hereby corrected as shown below:

ON THE TITLE PAGE item (56);

Section "Other Publications" -- Change "PCT/BG2004/002111" to -- PCT/GB2004/002111 --.

IN THE SPECIFICATION:

Column 1, Line 10: Change "May 14, 2004" to -- May 17, 2004 --.

Signed and Sealed this

Seventeenth Day of April, 2012

David J. Kappos
*Director of the United States Patent and Trademark Office*